United States Patent [19]

Cranston et al.

[11] Patent Number: 4,902,857
[45] Date of Patent: Feb. 20, 1990

[54] POLYMER INTERCONNECT STRUCTURE

[75] Inventors: Benjamin H. Cranston, Princeton; Lloyd Shepherd, Madison, both of N.J.

[73] Assignee: American Telephone and Telegraph Company, AT&T Bell Laboratories, Murray Hill, N.J.

[21] Appl. No.: 290,611

[22] Filed: Dec. 27, 1988

[51] Int. Cl.⁴ .................. H01R 9/00; H01R 11/01; H01R 43/00
[52] U.S. Cl. ................... 174/94 R; 29/872; 174/84 R; 428/328; 428/403; 439/66; 439/91
[58] Field of Search .............. 174/84 R, 94 R; 428/403, 328; 439/66, 91; 156/49; 29/872

[56] References Cited
PUBLICATIONS

H. H. Manko, *Solders and Soldering* (McGraw Hill, 1979), pp. 110–115.

Primary Examiner—Morris H. Nimmo
Attorney, Agent, or Firm—Robert B. Levy

[57] ABSTRACT

A conductive polymer interconnect structure (10) is comprised of an insulative polymer (18), a silicone or an epoxy, having a plurality of particles (20) arranged therein to provide conductive paths which extend in the z direction. At least a portion of those particles (20) proximate a separate one of the major surfaces of the matrix has at least a portion thereof coated with a solder 24 whose composition is tailored to melt below the cure temperature of the matrix (18). In this way, when the matrix (18) is sandwiched between a pair of conductive members (12 and 14) and the matrix is cured, a metallurgical bond, rather than a mechanical bond, will be formed between the members.

18 Claims, 1 Drawing Sheet

POLYMER INTERCONNECT STRUCTURE

TECHNICAL FIELD

This invention relates to a polymer interconnect structure which provides anisotropic electrical conductivity in its thickness or z direction and isolation in the x-y plane.

BACKGROUND OF THE INVENTION

There is presently a trend in the electronics industry towards achieving an ever greater density of circuits within a given area on a semiconductor chip, which has led to an increased number of more closely spaced input/output connections to the chip. When the semiconductor chip is packaged, each input/output connection on the chip is coupled to a lead or contact pad (hereinafter collectively referred to simply as "leads") on the package so that as the number of input/output connections increases, so too do the number of leads. To avoid increasing the package size as the number of leads increase, the size of and the spacing between leads are reduced. Presently, direct soldering or lead attachment (wire bonding) remains an effective technique for bonding the leads on a semiconductor chip package to a set of metallized areas on a circuit board. Such techniques are also employed for directly attaching a chip to a substrate such as a circuit board. However, as the lead pitch continues to decrease, soldering or lead bonding may no longer be feasible, and other interconnection techniques will be necessary.

Recently, polymer interconnect structures, comprised of electrically conductive particles mixed within an insulative polymer matrix, have shown much promise as an alternative interconnection technique to soldering. The particles, typically, silver-plated nickel or glass spheres, are dispersed or arranged in the polymer matrix prior to curing to create a plurality of laterally spaced conductive paths, each extending through matrix in the z direction. These conductive paths in the z direction are electrically insulated from each other and thus allow the polymer interconnect structure to exhibit anisotropic conductivity.

Presently there are two types of polymer interconnect structures. The first type of polymer interconnect structure, known as a "conductive polymer interface" (CPI) structure, is characterized by a polymer matrix fabricated from an elastic material, such as a silicone or the like. The conductive spheres in the CPI-type interconnect structure are aligned in lateral chains or columns which extend in the z direction, thus affording the structure its anisotropic conductivity.

The other type of interconnect structure, known as a "direct chip attach" (DCA) structure, is characterized by a polymer matrix fabricated from a thermoset or thermoplastic material, typically an epoxy, which is adhesive. Unlike the CPI interconnect structure, which contains chains of conductive spheres, the spheres within the DCA-type structure are arranged in a monolayer so that a portion of each sphere has a portion thereof proximate a major surface of the polymer matrix. As their name suggests, the DCA interconnect structures are primarily intended for directly attaching a semiconductor chip to a major surface of a substrate (i.e., a circuit board) so that each conductive pad on the chip is in electrical contact with a metallized area on the board.

With the present day CPI- and DCA-type interconnect structures, the conductivity is achieved by mechanical contact with the conductive spheres. This type of conductivity is generally effective because the polymer matrix tends to have a significantly higher coefficient of expansion than the conductive spheres. Hence, the conductive spheres are forced into contact with each other, when, in the case of the CPI-type structure, the structure is clamped between a pair of conductive members. In the case of the DCA-type structure, the adhesive properties of the matrix serve to hold the spheres in contact with the conductive members to be interconnected thereby.

However, the effectiveness of the electrical connection achieved by the mechanical contact of the spheres tends to degrade when there are temperature variations. Further, this type of electrical connection is susceptible to contamination and corrosion which is undesirable, especially with semiconductor chips which have an extreme sensitivity.

Thus, there is a need for a conductive polymer interconnect structure capable of providing a reliable bond notwithstanding temperature variations.

SUMMARY OF THE INVENTION

Briefly, the present invention is directed to a generally planar, anisotropic polymer interconnect (PI) structure which may be sandwiched between a pair of opposed conductive members to provide at least one conductive path therebetween. The PI structure of the invention comprises an insulative, generally planar polymer matrix, typically formed from a silicone or an epoxy, which after partial curing, forms a generally planar structure. A plurality of electrically conductive particles, typically spheres, are mixed in the polymer matrix prior to curing. During curing the particles are arranged in the polymer matrix to create a plurality of laterally spaced conductive paths extending between the opposed major surfaces thereof (i.e., in the z direction). Depending on whether the polymer matrix is a silicone (thus forming a "CPI"-type structure) or an adhesive epoxy (thus forming a "DCA"-type structure, the particles will be arranged either in chains or in a single monolayer. In accordance with the invention, there is at least one particle in each path through the polymer matrix which is proximate to one of the opposed major surfaces thereof and has at least a portion thereof coated with a solder which melts at a temperature not greater than the cure temperature of the polymer. In this way, when the structure is sandwiched between a pair of opposed conductive members and is then finally cured, the solder on the spheres in contact with each conductive member forms a metallurgical bond with the member rather than a less reliable mechanical bond. The solder applied to the particles may be comprised of an alloy containing one or more of the following: indium, lead, tin, bismuth, silver, gold and cadmium, for example.

DETAILED DESCRIPTION

Figure 1:
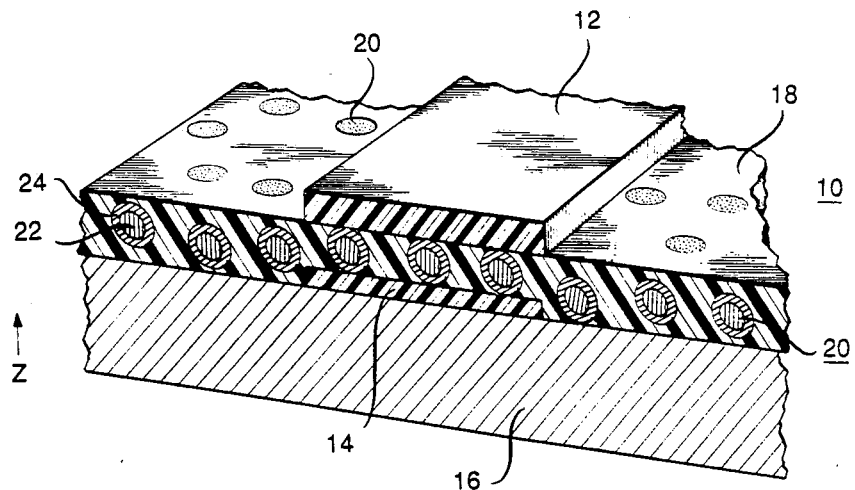
FIG. 1 is a perspective view, in cross section, of a preferred embodiment of a conductive polymer interconnect structure according to the present invention.

FIG. 1 is a perspective view, in cross section, of a preferred embodiment of an anisotropically conductive polymer interconnect (CPI) structure 10 in accordance with the teaching of the present invention. As seen in FIG. 1, the CPI structure 10 is sandwiched between a first conductive member 12 (i.e., a lead) and a second conductive member 14 (i.e., a metallized area on a major surface of a circuit board 16) to provide an electrical connection therebetween. In a first preferred embodiment, the CPI structure 10 comprises a polymer matrix 18 comprised of an sheet or slab of adhesive epoxy on the order of 0.025 mm (1 mil) thick. Typically, the matrix 18 is comprised of a "B" stage (partially cured) phenoxy-based resin. Final curing of the matrix 18 is accomplished by heating it at a temperature of 200° C. at 15 seconds or 100° C. for 30 minutes or some range in between, depending upon the polymer and/or the curing agent mixed therein.

Prior to partial curing of the matrix 18, a plurality of conductive particles 20, typically nickel or glass spheres 22 (1.7-0.5 mils or 43 $\mu$ to 13 $\mu$) in diameter, which are coated with a solder 24, are dispersed throughout the matrix. As the matrix 18 partially cures, the particles 20 are dispersed arranged there in a monolayer so as to provide conductive paths extending in the z direction (the direction between the opposed major surfaces of the matrix). The spacing between the particles 20 may be random, although, if desirable, the particles 20 could be uniformly spaced from each other.

The solder 24 which coats at least a portion of each sphere 22 has a composition which is tailored so the solder melts at a temperature no higher than the temperature at which the matrix 18 is finally cured, and preferably well below this temperature. In this way, when the matrix 18, with the particles 20 arranged therein, is sandwiched between the conductive members 12 and 14, and the matrix is then finally cured, the solder coating 24 on the spheres 22 will melt.

Typically, the solder 24 is an alloy comprised of tin, lead and bismuth, and either cadmium, thallium and/or indium, which are known to have melting temperatures between 56°-143° C. For a further description of low-temperature melting solders, reference should be had to page 110 of the text Solders and Soldering by H. H. Manko (McGraw Hill, 1979) (herein incorporated by reference). The presence of bismuth in the solder 24 is desirable because of the enhanced wetting afforded by the bismuth. Further, when the solder 24 is comprised of an alloy containing more than 47% bismuth, the solder will advantageously expand upon cooling rather than contract. Alternatively, the solder 24 could be comprised of indium itself or a gold-silver eutectic, although both are likely to be more expensive than those alloys which contain tin, lead and bismuth.

The advantage of coating with spheres 22 with the low temperature melting solder 24 is that when the matrix 18 is finally cured, the solder melts and creates a metallurgical bond between the members 12 and 14. Such a metallurgical bond is far less likely to separate during temperature fluctuations, as compared prior art mechanical bonds. Even if the temperature rises above the melting temperature of the solder 24, the solder, when liquid, will still wet the conductive members 12 and 14, assuring a reliable electrical connection therebetween.

Figure 2:
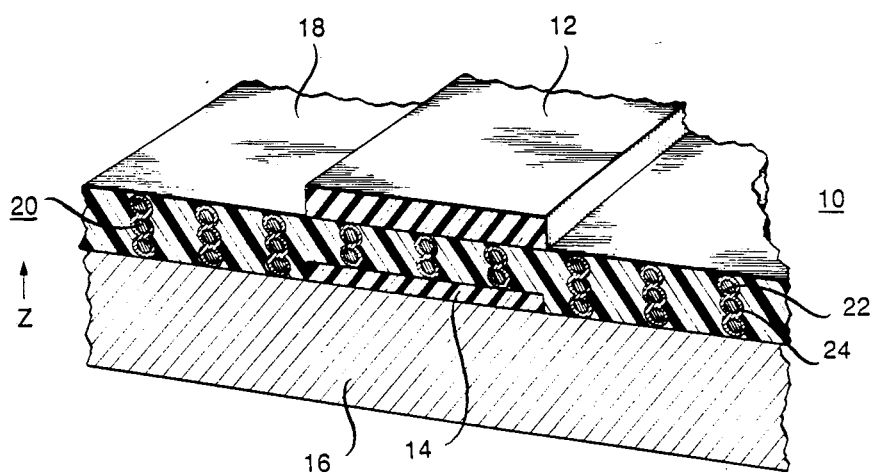
FIG. 2 is a perspective view, in cross section, of another preferred embodiment of a conductive polymer interconnect structure according to the present invention.

FIG. 2 shows an alternate embodiment of the CPI structure 10 of the present invention. The structure 10 depicted in FIG. 2 differs from the structure illustrated in FIG. 1 in several respects. First, the matrix 18 of the CPI structure 10 of FIG. 2 is comprised of a polymer, such as silicone, which in practice is thicker than the matrix of FIG. 1. Like the particles 20 of FIG. 1, the particles 20 of FIG. 2, which are comprised of spheres 22 at least partially coated with the low temperature solder 24, are mixed in the matrix 18 prior to the partial curing thereof. Unlike the particles 20 of FIG. 1, which are arranged in the matrix 18 in a monolayer, the particles 20 of FIG. 2 are arranged in the matrix 18 in chains which lie in the z direction. Each chain of particles 20 provides a conductive path between the opposed major surfaces of the matrix 18. To this end, it is desirable that the spheres 22 of FIG. 2 be made from a ferromagnetic metal such as nickel, so the particles 20 can be magnetically aligned into chains which are uniformly spaced apart before curing.

The composition of the solder 24 on the spheres 22 of FIG. 2, like that of FIG. 1, is tailored to melt at or below the temperature at which the matrix 18 of FIG. 2 is finally cured. In this way, when the matrix 18 of FIG. 2 is sandwiched between the conductive members 12 and 14 and is then finally cured, the solder 24 on the spheres 22 will melt. Thus, the particles 20 in each chain now become metallurgically bonded to each other and to the conductive members 12 and 14 in contact therewith. The resultant metallurgical bond between the members 12 and 14 of FIG. 2, like that between the members 12 and 14 of FIG. 1, is far less likely to separate during temperature fluctuations, as compared to a mechanical bond.

The spheres 22 of FIG. 1 and 2 are typically plated with the solder 24 so that the entire sphere is coated. However, to achieve a metallurgical bond between each of the members 12 and 14, it is not necessary to entirely plate the spheres 22 with the solder 24. Rather, it is only necessary to provide the solder 24 on that portion of each sphere 22 which is in contact with a separate one of the members 12 and 14. For example, the CPI structure of FIGS. 1 and 2 could be manufactured by first mixing nickel or silver-plated nickel spheres 22 within the uncured matrix 18 and then appropriately arranging the spheres as the matrix partially cures to provide conductive paths extending in the z direction.

After partial curing of the matrix 18, the opposed major surfaces of the matrix would then be etched, typically with a plasma, to expose a portion of those spheres 22 proximate a separate one of the major surfaces of the matrix. Thereafter, the low temperature solder 24 would be reflowed and deposited on each major surface of the matrix 18. The deposited solder 24 will adhere only to that portion of each sphere 22 exposed after etching but will not adhere to the matrix 18 itself. When matrix 18 is sandwiched between the conductive members 12 and 14 so that the solder 24 on each sphere 22 is in contact with one of the members, a metallurgical bond can be formed therebetween by the solder when the matrix is finally cured.

The process of etching the matrix 18 and then applying the solder 24 to the exposed portion of the spheres 22 is more useful when the particles 20 are arranged in the matrix in a monolayer as in FIG. 1 as opposed to chains as in FIG. 2. When the particles 20 are arranged in chains, as seen in FIG. 2, it is desirable for all the spheres 22 to be coated with solder, rather than just those proximate a major surface of the matrix 18. The reason is that if all the spheres 22 are coated with solder as seen in FIG. 2, then a metallurgical bond will advantageously be formed between the spheres rather than a mechanical one.

The foregoing discloses an conductive polymer interconnect structure 10 comprised of an insulative polymer matrix 18 arranged within which are particles 20 (spheres 22) at least some of which are partially coated with a solder 24 which melts at or below the cure temperature of the matrix.

It is to be understood that the above-described embodiments are merely illustrative of the principles of the invention. Various modifications and changes may be made thereto by those skilled in the art which will embody the principles of the invention and fall within the spirit and scope thereof.

We claim:

1. In combination with each of a pair of opposed, spaced-apart conductive members, a generally planar polymer interconnect (PI) structure, which exhibits anisotropic conductivity in the z direction between its opposed major surfaces, the PI structure being sandwiched between the conductive members such that each of the opposed major surfaces of the structure is in contact with one of the members, the PI structure comprising:
   an insulative polymer matrix which is cured to form a generally planar structure; and
   a plurality of electrically conductive particles arranged in the polymer matrix to create a plurality of lateraly spaced, conductive paths extending between the opposed major surfaces of the polymer structure such that at least one of the particles in at least one of the paths is in contact with a separate one of the conductive members, wherein improvement comprises:
   at least a portion of those particles proximate a separate one of the opposed major surfaces of the cured polymer structure has at least a portion thereof coated with a solder whose composition is such that the solder melts at a temperature no greater than the cure temperature of the polymer matrix so that during curing, each solder-coated particle in contact with one of the conductive members forms a metallurgical bond therewith.

2. The apparatus according to claim 1, wherein the solder is comprised of an alloy of tin, lead and bismuth.

3. The apparatus according to claim 3, wherein the solder is comprised of an alloy containing at least 47% bismuth.

4. The apparatus according to claim 1, wherein the solder is comprised of indium.

5. The apparatus according to claim 1, wherein the solder is comprised of a gold-silver eutectic.

6. The apparatus according to claim 1, wherein the polymer matrix is comprised of a silicone.

7. The apparatus according to claim 1, wherein the polymer matrix is comprised of an epoxy.

8. A generally planar, conductive polymer interconnect (PI) structure which exhibits anisotropic conductivity in the z direction between its opposed major surfaces, comprising:
   an uncured insulative polymer matrix which is cured to form a generally planar structure; and
   a plurality of electrically conductive particles arranged in the polymer matrix to create a plurality of laterally spaced, conductive paths extending between the opposed major surfaces of the cured polymer structure such that at least one of the particles in each path is proximate a separate one of the opposed surfaces of the polymer, wherein improvement comprises:
   at least a portion of those particles proximate a separate one of the opposed major surfaces of the cured polymer structure has at least a portion thereof coated with a solder whose composition is such that the solder melts at a temperature no greater than the cure temperature of the polymer matrix.

9. The apparatus according to claim 8, wherein the solder is comprised of an alloy of tin, lead and bismuth.

10. The apparatus according to claim 9, wherein the solder is comprised of an alloy containing at least 47% bismuth.

11. The apparatus according to claim 8, wherein the solder is comprised of indium.

12. The apparatus according to claim 8, wherein the solder is comprised of a gold-silver eutectic.

13. The apparatus according to claim 8, wherein the polymer matrix is comprised of a silicone.

14. The apparatus according to claim 8, wherein the polymer matrix is comprised of an epoxy.

15. A method for manufacturing a polymer interconnect structure which affords anisotropic conductivity in the z direction comprising the steps of:
   mixing a plurality of conductive particles in an uncured insulative polymer;
   at least partially curing the polymer to form a generally planar matrix; while
   arranging the particles in the polymer to obtain a plurality of laterally spaced conductive paths extending through the matrix in the z direction to achieve anisotropic conductivity, wherein improvement comprises:
   at least partially coating those particles which are each proximate a separate one of the opposed surfaces of the matrix with a solder whose composition is tailored so the solder melts at a cure temperature not greater than the cure temperature of the polymer.

16. The method according to claim 15, wherein each of the particles is substantially coated with solder prior to being mixed in the polymer.

17. The method according to claim 15, wherein those particles which are proximate each major surface of the matrix are coated with solder by the steps of:
   etching each major surface of the matrix after partial curing to expose at least a portion of those particles proximate the surface; and
   applying solder to the exposed portion of those particles proximate the surface.

18. A method of establishing an electrical connection between each of a pair of opposed conductive members comprising the step of:
   sandwiching a polymer interconnect structure, comprised of an insulative polymer having a plurality of conductive particles mixed therein and then arranged so as to provide a plurality of laterally spaced conductive paths extending in the z direction between the members such that at least one particle in at least one path is in contact with each conductive member, wherein the improvement comprises:
   each particle in contact with a separate one of the conductive members is at least partially coated with a solder whose composition is tailored to melt at a temperature below the cure temperature of the polymer; and curing the polymer at a temperature above the melting point of the solder so that the solder on the particle melts and forms a metallurgical bond with the conductive member.

* * * * *